United States Patent
Gwin et al.

(10) Patent No.: US 6,809,928 B2
(45) Date of Patent: Oct. 26, 2004

(54) SEALED AND PRESSURIZED LIQUID COOLING SYSTEM FOR MICROPROCESSOR

(75) Inventors: Paul J. Gwin, Orangevale, CA (US); Rolf A. Konstad, Gold River, CA (US); Peter A. Davison, Puyallup, WA (US); Mark A. Trautman, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 90 days.

(21) Appl. No.: 10/330,915

(22) Filed: Dec. 27, 2002

(65) Prior Publication Data

US 2004/0125561 A1 Jul. 1, 2004

(51) Int. Cl.[7] .................................................. H05K 7/20
(52) U.S. Cl. ................. 361/699; 165/80.4; 165/104.26; 361/702; 361/701; 361/697
(58) Field of Search .............................. 165/80.3–80.4, 165/104.26–104.33, 121, 122, 126; 174/15.1, 16.1; 361/688–689, 694–703, 715

(56) References Cited

U.S. PATENT DOCUMENTS

| | | | |
|---|---|---|---|
| 4,010,489 A | * | 3/1977 | Bourbeau et al. ............ 257/714 |
| 4,047,561 A | | 9/1977 | Jaster et al. |
| 5,323,847 A | * | 6/1994 | Koizumi et al. ....... 165/104.33 |
| 5,731,954 A | * | 3/1998 | Cheon ......................... 361/699 |
| 6,091,145 A | * | 7/2000 | Clayton ....................... 257/724 |
| 6,167,947 B1 | * | 1/2001 | Hokanson et al. .......... 165/80.3 |
| 6,234,240 B1 | | 5/2001 | Cheon |
| 6,351,381 B1 | * | 2/2002 | Bilski et al. ................. 361/695 |
| 6,366,461 B1 | * | 4/2002 | Pautsch et al. .............. 361/690 |
| 6,587,343 B2 | * | 7/2003 | Novotny et al. ............. 361/698 |

FOREIGN PATENT DOCUMENTS

EP 1 207 446 A1 5/2002

OTHER PUBLICATIONS

US 2003/017876 A1 "System And Method For Providing Cooling System With Heat Exchangers" Jenkins et al Sep. 25, 2003.*

"PCT International Searching Authority—Partial International Search Report", dated Jun. 1, 2004 for PCTUS03/39193, 6pgs.

* cited by examiner

Primary Examiner—Gregory Thompson
(74) Attorney, Agent, or Firm—Buckley, Maschoff & Talwalkar LLC

(57) ABSTRACT

According to some embodiments, a cooling system that may be installed in a computer chassis has a fluid-containing space that is sealed and pressurized by an inert gas. The fluid-containing space may be formed from a cold plate that may serve as a heat sink for an integrated circuit, a heat exchanger, tubing, and a pump volume. A coolant may be contained in the fluid-containing space.

28 Claims, 5 Drawing Sheets

SEALED AND PRESSURIZED LIQUID COOLING SYSTEM FOR MICROPROCESSOR

BACKGROUND

As microprocessors increase in size and complexity, increased demands are placed on heat sink arrangements for microprocessors. Consequently, liquid-based heat sink arrangements have been proposed, including a cold plate mounted to serve as a heat sink with a coolant liquid flowing through the cold plate.

Conventional liquid-based cooling systems for microprocessors suffer from a number of disadvantages. For example, conventional liquid-based cooling systems may require servicing and may not perform reliably throughout a desired useful life of the computers in which such cooling systems are installed.

DETAILED DESCRIPTION

Figure 1:
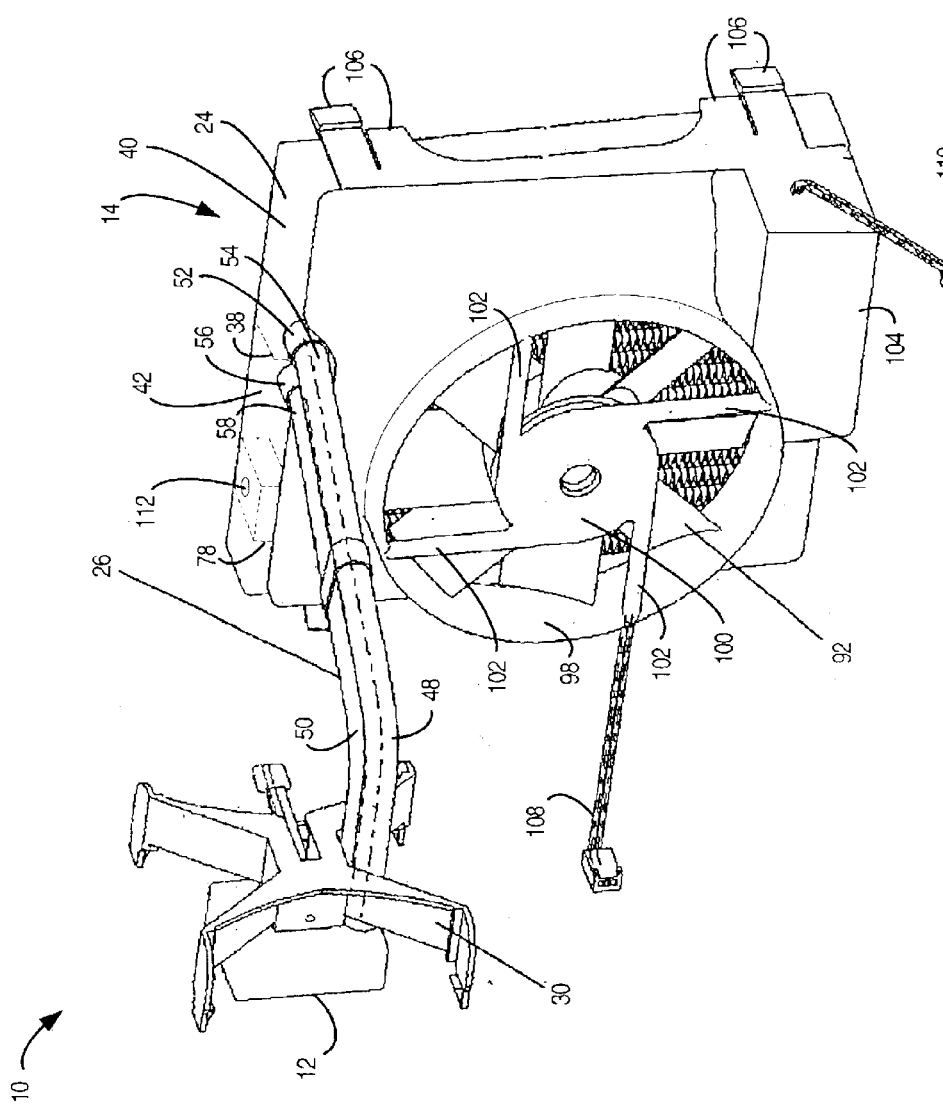
FIG. 1 is an isometric view of a cooling system according to some embodiments.
Figure 2:
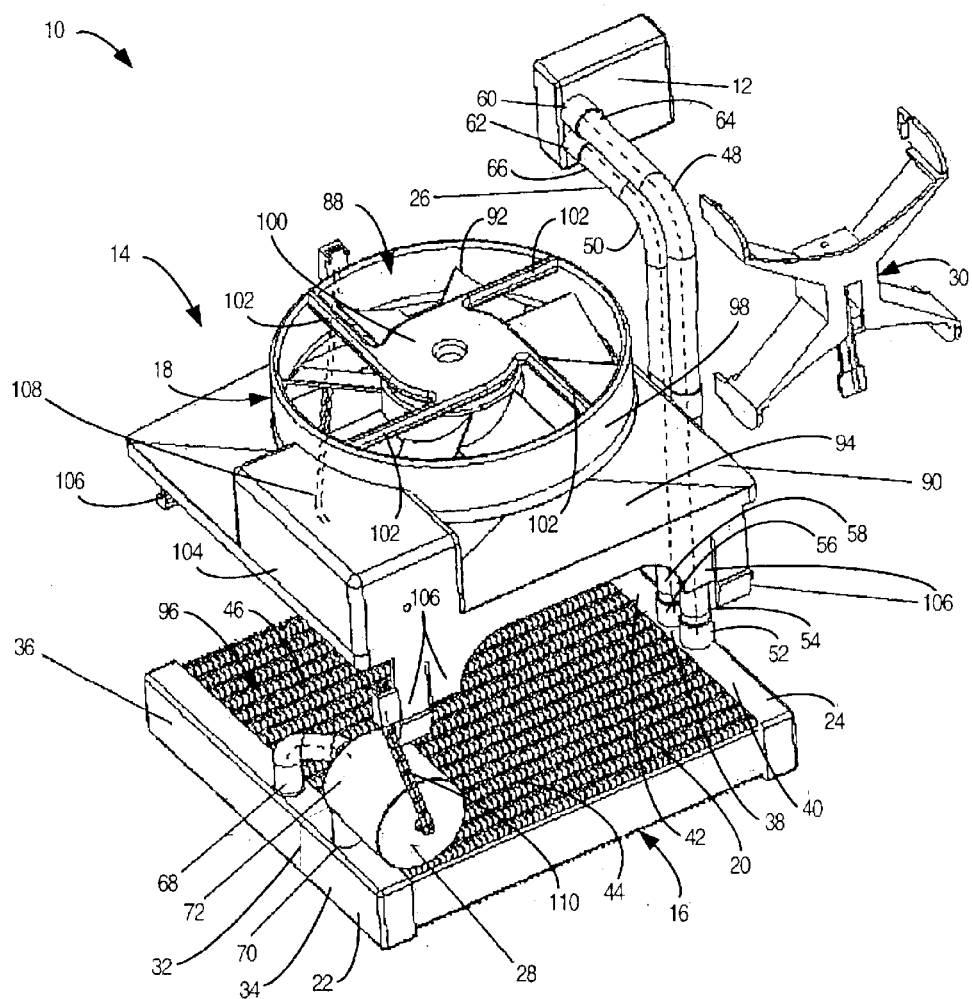
FIG. 2 is an exploded view of the cooling system of FIG. 1.

FIG. 1 is an isometric view of a sealed and pressurized liquid cooling system for a microprocessor according to some embodiments. FIG. 2 is an exploded view of the liquid cooling system. FIGS. 1 and 2 show the cooling system 10, which includes a cold plate 12 and a heat exchange unit 14. The heat exchange unit 14 includes a heat exchanger 16 (FIG. 2) and a fan assembly 18. The heat exchanger 16 includes a core portion 20, a first heat exchanger tank 22 and a second heat exchanger tank 24. The first heat exchanger tank 22 and the second heat exchanger tank 24 are coupled to the core portion 20 of the heat exchanger 16 at opposite sides of the core portion 20. The heat exchanger in some embodiments has a generally flat and rectangular configuration (as shown in FIG. 2), but other configurations may be used.

The cooling system 10 also includes tubing 26 that interconnects the cold plate 12 and the heat exchanger 16. More specifically, the tubing 26 connects the cold plate 12 to the second heat exchanger tank 24 of the heat exchanger 16.

The cooling system 10 also includes a pump 28 that is coupled to the first heat exchanger tank 22. The pump 28 may operate to circulate a liquid coolant (not visible in FIGS. 1 and 2) through the cooling system 10.

A retention clip 30 may be provided with the cooling system 10 to hold the cold plate 12 in a suitable position to cool a microprocessor (not shown in FIGS. 1 and 2) or another type of integrated circuit (not shown). The retention clip 30 may be constructed in accordance with conventional practices.

In some embodiments, the first heat exchanger tank 22 may be divided by a wall 32 into an outbound portion 34 and an inbound portion 36. Similarly, the second heat exchanger tank 24 may be divided by a wall 38 (FIGS. 1 and 2) into an outbound portion 40 and an inbound portion 42. An outbound section 44 (FIG. 2) of the core portion 20 of the heat exchanger 16 allows coolant to flow from the outbound portion 34 of the first heat exchanger tank 22 to the outbound portion 40 of the second heat exchanger tank 24. An inbound section 46 of the core portion 20 of the heat exchanger 16 allows coolant to flow from the inbound portion 42 of the second heat exchanger tank 24 to the inbound portion 36 of the first heat exchanger tank 22.

The tubing 26 includes an outbound tube 48 and an inbound tube 50. The heat exchanger 16 has an outlet port 52 by which a proximal end 54 of the outbound tube 48 is coupled to the outbound portion 40 of the second heat exchanger tank 24. The heat exchanger 16 also has an inlet port 56 by which a proximal end 58 of the inbound tube 50 is coupled to the inbound portion 42 of the second heat exchanger tank 24. The outlet port 52 and the inlet port 56 may be located adjacent to each other, as illustrated in FIGS. 1 and 2, with the locus of the wall 38 between the ports 52 and 56.

The cold plate 12 has an inlet port 60 and an outlet port 62 which may be located adjacent to each other as shown in FIG. 2. A distal end 64 of the outbound tube 48 is coupled to the cold plate 12 via the inlet port 60. A distal end 66 of the inbound tube 50 is coupled to the cold plate 12 via the outlet port 62.

In some embodiments, the tubes 48, 50 are flexible, easily routed, substantially resistant to laceration and kinking, have an extremely low water vapor transmission rate, and can be manufactured at low cost. Tubes 48, 50 may, for example be formed of one or more of the following materials: FEP, PVDF, ETFE, PTFE or a fluoro-elastomer, such as a fluorinated EPDM rubber (e.g., Viton, available from DuPont). Tubes 48, 50 may be formed by extrusion, for example. Tubes 48, 50 may be formed of the materials mentioned above in combination with other materials. For example, a co-extrusion process may be employed to produce the tubes 48, 50 so as to have two or more layers, each of which is formed of a different material. In some embodiments, the tubes may have two layers including an inner layer formed of one of FEP, PVDF, ETFE, PTFE or a fluoro-elastomer and an outer layer of nylon, for example. Tube-in-tube construction may also be employed for each of the tubes 48, 50.

Forming the tubes of one or more of FEP, PVDF, ETFE, PTFE or a fluoro-elastomer is particularly advantageous in that such materials provide an extremely low water vapor transmission rate. This characteristic, either alone or in combination with other features of the cooling system described herein, may allow the cooling system to operate properly for an extended period (e.g., 7 years), without excessive loss of coolant through evaporation, and without servicing.

The tubes 48, 50 may, as shown, be arranged in a parallel course from the heat exchanger 16 to the cold plate 12, and may be in contact with each other (e.g., attached or bound to each other) substantially entirely along that course. This may facilitate convenient routing of the tubes. The adjacent location of the outlet port 52 and the inlet port 56 of the heat exchanger 16 and the adjacent location of the inlet port 60 and the outlet port 62 of the cold plate 12 may also facilitate convenient routing of the tubes.

Figure 3:
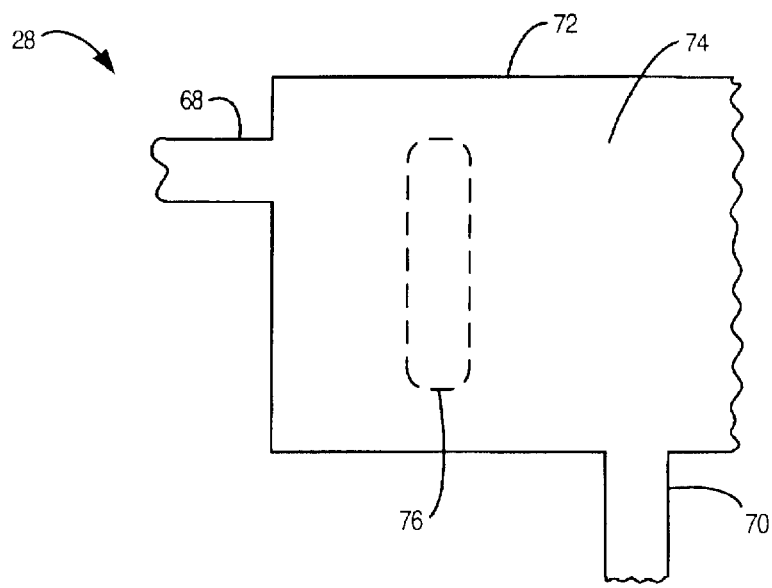
FIG. 3 is a partial simplified schematic cross-sectional view of a pump that is part of the cooling system of FIG. 1.

The pump 28 has an inlet port 68 by which the pump is coupled to the inbound portion 36 of the first heat exchanger tank 22. The pump also has an outlet port 70 by which the pump is coupled to the outbound portion 34 of the first heat exchanger tank. Additional details of the pump will now be described with reference to FIG. 3, which is a partial simplified schematic cross-sectional view of the pump. As seen from FIG. 3, the pump 28 includes a pump housing 72 which defines a pump volume 74. (Spaces within the pump inlet and outlet ports may also be considered part of the pump volume.) A pump impeller 76 (shown in phantom) is mounted within the pump volume 74. To simplify the drawing, a pump motor which drives the pump impeller is omitted from FIG. 3.

In some embodiments, one or both of the pump housing 72 and the heat exchanger 16 may be formed at least in part of a material, such as a liquid crystal polymer, which is moldable and provides for an extremely low water vapor transmission rate. This feature, alone or in combination with other features of the cooling system described herein, may allow the cooling system to be produced at low cost and to have an extended service life. Examples of suitable liquid crystal polymer materials are: Zenite, Xydar, and Ticona. The inlet and outlet ports of the pump 28 may be molded in whole or in part with the pump housing 72 and/or may be formed in whole or in part of tubing like the tubes 48, 50. Also, portions of the tubes 48, 50 may be rigid molded tube sections formed, e.g., of liquid crystal polymer. To provide or enhance flexibility for the tubes, the tubes may have convolutions (i.e. variations in the outer diameters of the tubes).

In some embodiments the convolutions may have a pitch of one-sixteenth inch.

The pump volume 74, the heat exchanger 16, the cold plate 12 and the tubing 26 may be considered to form a fluid-containing space in which the coolant (not shown in FIGS. 1–3) is contained.

Figure 4:
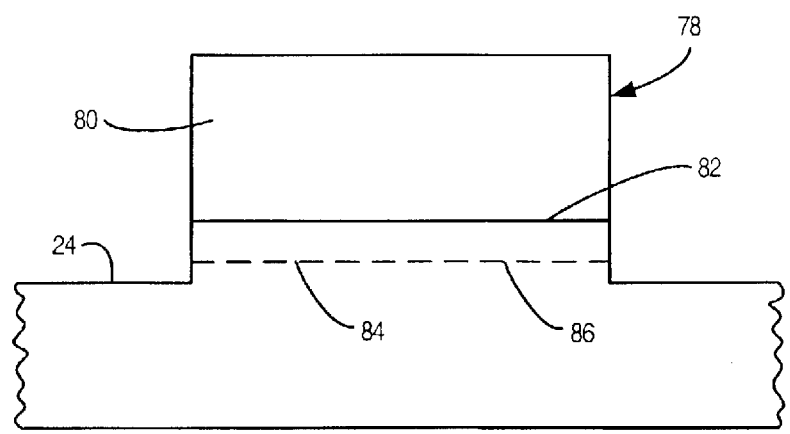
FIG. 4 is a schematic cross-sectional view of a gas-bubble-confinement portion of the cooling system of FIG. 1.

In some embodiments, the cooling system 10 may include a gas-bubble-confinement portion 78, which may be integrated, for example, with the second heat exchanger tank 24, as indicated in FIG. 1. FIG. 4 is a schematic cross-sectional view showing some details of the gas-bubble-confinement portion 78. The gas-bubble-confinement portion holds a bubble 80 of gas which pressurizes coolant 82 contained within the cooling system 10. The gas-bubble-confinement portion includes a gas barrier 84, which may aid in confining the pressurizing gas within the gas-bubble-confinement portion 78. The gas barrier 84 may be a screen or perforated plate having perforations 86 which may be shaped and sized such that surface tension in the coolant 82 tends to prevent the gas from exiting from the gas-bubble-confinement portion 78, even in the event of a change in orientation of the heat exchange unit 14. Thus the perforations 86 may be configured to allow passage of the coolant therethrough while preventing passage of the pressurizing gas therethrough.

In some embodiments, the pressurizing gas may be an inert gas, such as substantially pure nitrogen, to minimize potential corrosion of the cooling system 10. In some embodiments, the coolant may be a propylene glycol based liquid such as a mixture of water, propylene glycol and corrosion inhibitors. One suitable coolant is Dowfrost HD, available from the Dow Chemical Company. A coolant of this type may provide advantages of low toxicity, corrosion resistance, low electrical conductivity, low freezing temperature (e.g., less than −40° C.), and recyclability. Using a coolant having low electrical conductivity may be advantageous in that in the event of leaking of the coolant, there may be a reduced risk of short-circuiting components of a computer in which the cooling system was installed.

Referring once more to FIG. 2, the fan assembly includes a fan 88 and a fan shroud 90. The fan 88 includes a fan impeller 92, which is rotated by a fan motor (not shown in FIGS. 1 and 2) to impel air toward the core portion 20 of the heat exchanger 16. (As used herein, "impelling air toward the heat exchanger" includes both pushing air from the fan 90 toward the heat exchanger and drawing air from the direction of the heat exchanger toward the fan.)

The fan shroud 90 includes a substantially rectangular base 94 which is shaped and sized to match a major face 96 of the heat exchanger 16. The fan shroud further includes a generally cylindrical fan housing 98 which is integrally formed with the base 94. A mounting hub 100 is positioned at an upper central location relative to the fan housing 98 by means of struts 102 that radiate eccentrically from the mounting hub to join the fan housing. The fan impeller 92 and the fan motor (not shown in FIG. 2) are mounted interiorly of the mounting hub 100 within the fan housing 98. The fan shroud 90 further includes a generally parallelepiped enclosure 104 (e.g., as illustrated in FIG. 22, an enclosure in the shape of a rectangular prism) which is configured to accommodate the pump housing 72 when the fan assembly 18 is secured to the heat exchanger 16. The interior of the enclosure 104 may be in fluid communication with the fan housing 98.

In some embodiments, a number of snap-fittings 106, such as snap-in-place barbs and/or L-shaped extensions, extend downwardly from the base 94 (i.e., in the direction opposite to the fan housing). The snap-fittings 106 are provided so as to allow the fan assembly 18 to be secured to the heat exchanger 16 without use of fasteners or tools. The snap-fittings also allow the heat exchange unit 14 to be secured to a computer chassis (not shown in FIGS. 1 and 2) without use of fasteners or tools.

In some embodiments, the fan shroud 90 may be formed as a single, integrated piece of molded plastic, incorporating the base 94, the fan housing 98, the mounting hub 100, the struts 102, the enclosure 104 and the snap-fittings 106.

A fan electrical connection 108 is provided to allow electrical power to be transmitted to the fan motor (not shown in FIGS. 1 and 2), and a pump electrical connection 110 is provided to allow electrical power to be transmitted to the pump motor (not shown in FIGS. 1 and 2). The electrical connections 108, 110 may be configured to be plugged into standard fan headers on a motherboard (not shown in FIGS. 1 and 2). The electrical connections 108, 110 may be two- or three-wire cables to allow for monitoring of the operation of the cooling system, as described below. The fan shroud 90 may include one or more channels to accommodate, and determine the path of, one or both of the electrical connections 108, 110. For example, the fan electrical connection 108 may be routed through one of the struts 102, as indicated in FIG. 1. That is, the strut may include a channel to accommodate power wiring for the fan 88.

In some embodiments, a fill port 112 (FIG. 1) may be provided to allow the cooling system to be charged with coolant and pressurizing gas. For example, the fill port may be associated with one of the beat exchanger tanks (e.g., the second heat exchanger tank 24), and may be associated with the gas-bubble-confinement portion 78 of the fluid-containing space, as illustrated in FIG. 1.

Upon charging the cooling system, the fluid-containing space may be evacuated to a pressure that is slightly above the vapor pressure of the coolant, and then the fluid-containing space may be filled with an appropriate volume of coolant such that possible expansion of the coolant, due to environmental factors or the like, will be accommodated by the gas-containing volume of gas-bubble-confinement portion 78. The volume of coolant in the cooling system may also be such that, even after contraction due to environmental factors or the like, or loss of volume over time, due to vapor transmission through components of the cooling system, the coolant will be of sufficient volume to partially fill the gas-bubble-confinement portion 78, as illustrated in FIG. 4. The gas-bubble-confinement portion 78 may also be of a size such as to satisfy the considerations stated in the previous two sentences. In some embodiments, the volume of coolant may be such as to accommodate a storage and/or transport temperature range of −40° to +70° C. After filling with coolant to the extent described above, the fluid containing space may be back-filled with pressurizing gas, so that the cooling system is sufficiently gas pressurized to prevent cavitation at the pump 28 during operation of the cooling system. The fill port may take the form of a tube, which may be pinched off and sealed, by braising or spot welding for example, after filling of the cooling system with coolant and pressurizing gas.

In some embodiments, the heat exchange unit 14 may be configured so as to be secured to a front panel of a computer chassis. In such a configuration, the heat exchange unit may generally have the shape of a rectangular prism, with dimensions 152 mm×165 mm×64 mm. Such a configuration of the heat exchange unit is believed to allow it to fit into many of the available volumes of conventional computer chassis. Accordingly some embodiments of the cooling system may be suitable for use with a wide variety of conventional computers. In another configuration of the heat exchange unit, changes may be made in the shapes of the heat exchanger and/or of the fan shroud, and/or the pump may be repositioned relative to the heat exchanger, such that the heat exchange unit has an L-shaped profile, with a depth of 152 mm, the long leg of the "L" having a length of 241 mm, the short leg of the "L" having a length of 76.2 mm and a height of 165 mm. The latter configuration of the heat exchange unit may be suitable for mounting on a side panel of a computer chassis. Various other changes in the profile and/or dimensions of the heat exchange unit may be made.

The cold plate may have a processor-facing surface with dimensions 45 mm×38 mm, with a depth of 25.4 mm. These dimensions may be varied. The cold plate may be configured to allow for interfacing the cold plate to a microprocessor in a conventional manner.

In some embodiments, the cooling system 10 may be configured for use in conventional ATX and uATX chassis.

Figure 5:
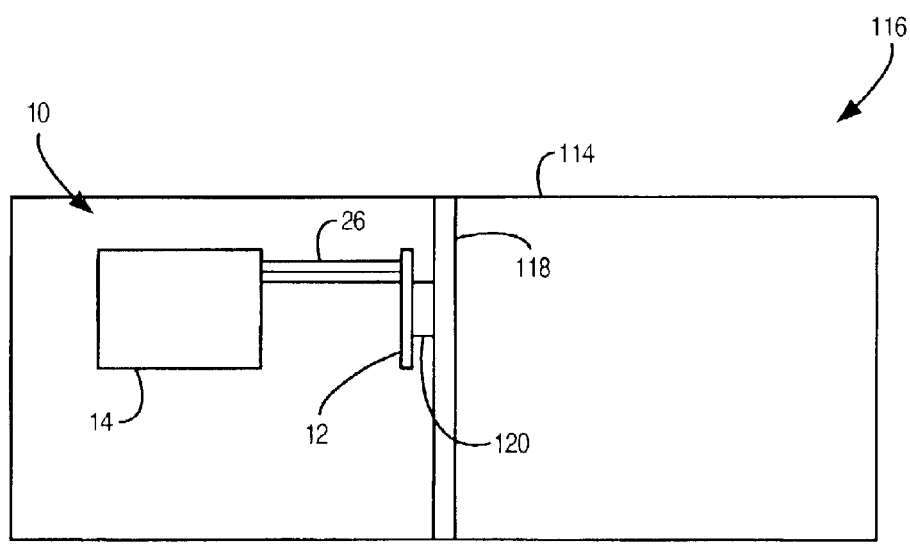
FIG. 5 is a simplified schematic side view of an interior of a computer according to some embodiments.

FIG. 5 schematically illustrates a typical manner in which an embodiment of the cooling system 10 may be installed in a computer chassis 114 which is part of a computer 116. The computer 116 also includes a motherboard 118 installed in the chassis 114 and a microprocessor 120 (which is to be cooled) mounted on the motherboard 118. The cooling system 10 also forms part of the computer 116, with the heat exchange unit 14 of the cooling system mounted on the chassis 114 and the cold plate 12 interfaced to the microprocessor 120 so as to provide cooling for the microprocessor. As an alternative to the straight course shown in FIG. 5 for tubing 26, a curved and/or angled course may be implemented, because the tubing may be flexible in some embodiments. (To simplify the drawing, other components of the computer 116 are omitted and power connections for the cooling system are not shown.)

In operation, the pump 28 (FIG. 2) operates to cause coolant to flow through the cooling system 10, and the fan 88 operates to cause air to flow through the core portion 20 of the heat exchanger 16. More specifically, coolant flows from the pump 28 via the pump outlet port 70 to the outbound portion 34 of the first heat exchanger tank 22. The flow of coolant continues from the outbound portion 34 of the first heat exchanger tank 22 through the outbound section 44 of the core portion 20 of the heat exchanger to the outbound portion 40 of the second heat exchanger tank 24. While the coolant flows through the outbound section 44 of the core portion 20, heat may be transferred from the coolant to the air flowing through the core portion, thereby cooling the coolant. The coolant continues to flow from the outbound portion 40 of the second heat exchanger tank via the heat exchanger outlet port 52 and the outbound tube 48 to the cold plate 12 (via the inlet port 60 of the cold plate 12). While the coolant circulates in the cold plate, heat may be transferred from the microprocessor 120 (FIG. 5) to the coolant via a microprocessor-facing surface of the cold plate, thereby cooling the microprocessor.

The heated coolant flows from the cold plate 12 via the cold plate outlet port 62, the inbound tube 50, and the heat exchanger inlet port 56, to the inbound portion 42 of the second heat exchanger tank 24. The flow of coolant continues from the inbound portion 42 of the second heat exchanger tank through the inbound section 46 of the core portion 20 of the heat exchanger to the inbound portion 34 of the first heat exchanger tank 22. While the coolant flows through the inbound section 46 of the core portion 20, heat may be transferred from the coolant to the air flowing through the core portion, thereby cooling the coolant. The coolant continues to flow from the inbound portion 34 of the first heat exchanger tank 22 to the pump 28 via the pump inlet port 68.

Thus, in some embodiments, the coolant may be cooled by air flowing through the core portion of the heat exchanger both while the coolant is flowing toward the pump through the inbound section of the core portion and while the coolant is flowing away from the pump through the outbound section of the core portion. However, other embodiments of the cooling system are possible, in which, for example, the pump is located between the heat exchanger and the cold plate, so that the coolant is cooled only on the way to the pump or only on the way from the pump.

Figure 6:
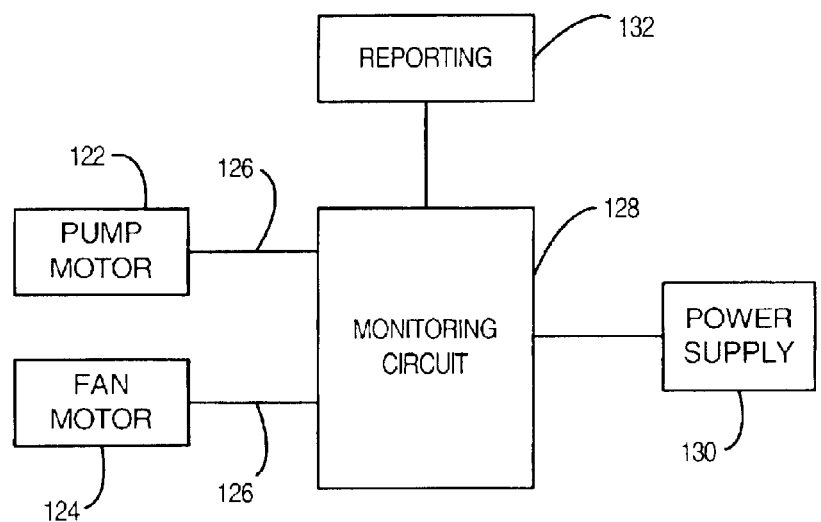
FIG. 6 is a diagram of a monitoring arrangement for the cooling system of FIG. 1 according to some embodiments.
Figure 7:
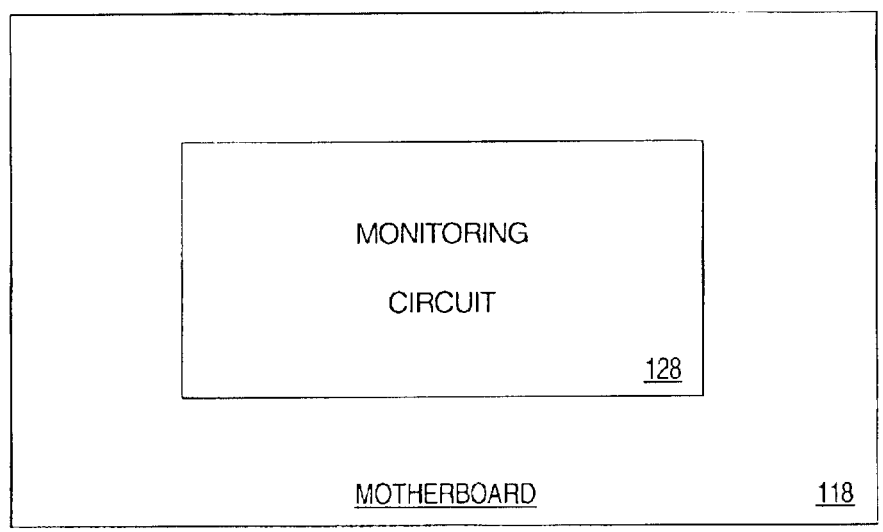
FIG. 7 is a schematic representation of a mounting arrangement according to some embodiments for a monitoring circuit shown in FIG. 6.

In some embodiments, an arrangement may be provided to monitor operation of the pump and fan motors. Such an arrangement is diagrammatically illustrated in FIG. 6. The pump motor 122 and the fan motor 124 may be coupled by signal paths 126 to a monitoring circuit 128. The signal paths may be implemented via the electrical connections 108, 110 (FIGS. 1 and 2) through which power is supplied to the fan and pump motors. For example, respective square wave feedback signals may be provided from the pump and fan motors to provide rpm information concerning the motors. Alternatively, respective back EMF signals may be received by the monitoring circuit 128 from the motors. The monitoring circuit may include the microprocessor 120 (FIG. 5) and may be mounted on the motherboard 118 as schematically illustrated in FIG. 7. If the monitoring circuit 128 includes the microprocessor, the microprocessor may be programmed (a) to receive signals indicating the rpm's of the motors, (b) to compare the motor rpm's with suitable parameters, and (c) to provide an indication to a user when one or both of the motors are not operating in an appropriate fashion.

Referring again to FIG. 6, the monitoring circuit 128 may be connected between the motors and a power supply 130 and may also be coupled to one or more reporting devices 132. In some embodiments, a multifunctional LED may be provided as a reporting device 132, and may be controlled by the monitoring circuit to emit light of a certain color when the motors are operating properly and to emit light of a different color when at least one of the motors is not operating properly. In addition or alternatively, a display unit (not shown) of the computer 116 may be employed as a reporting device 132 to indicate whether or not the motors are operating properly.

In some embodiments, the monitoring circuit 128 may also have capabilities for adjusting the rpm's of one or both of the motors or for otherwise controlling the motors.

A cooling system which includes some or all of the features described above may be capable of operating without servicing for an extended life of the cooling system and the computer in which it is installed. For example, in some embodiments, the cooling system may operate without servicing or failure for a period of 7 years. Because the cooling system is sealed, it may remain free of leakage, bio-growth and corrosion. Materials from which system components are constructed may be selected, as described above, so that coolant loss by vapor transmission through the components is extremely low, to prevent the cooling system from failing during its intended service life due to loss of coolant and to reduce or eliminate any need for servicing to add coolant. It may also be possible to store and/or ship the cooling system in a sealed condition, charged with coolant and pressurizing gas and ready to install, over a wide range of temperature conditions (e.g., −40° to +70° C.). The cooling system may be charged with coolant and pressurized in such a manner that the pressure within the cooling system does not exceed 40 psi, so that the charged cooling system satisfies regulations in regard to shipment by air. Consequently, shipment of the present cooling system by air or otherwise becomes feasible even when the cooling system is charged with coolant and pressurizing gas. By contrast, conventional liquid based cooling systems for computers are not sealed and are likely to fail in less than 7 years, due to fluid loss and/or corrosion. Moreover, conventional liquid based cooling systems may require servicing, cannot be shipped while charged with coolant, and cannot be stored at extreme temperatures.

Tube routing with conventional cooling systems may be clumsy and inconvenient, but embodiments of the present cooling system, with tubes that are flexible and are routed in parallel and in contact with each other, may simplify and facilitate tube routing, and may allow the cooling system described herein to be installed in chassis that have a wide variety of different geometries. In some embodiments, the adjacent location of the heat exchanger inlet and outlet ports, and the adjacent location of the cold plate inlet and outlet ports may also promote convenient tube routing.

Conventional tubing for liquid-based computer cooling systems generally fails to provide any one of laceration-resistance, kink resistance, flexibility, low cost and low water vapor transmission rates that are features of the tubing described herein. Conventional heat exchangers and pumps also fail to exhibit the low vapor transmission rates that are provided in some embodiments of the present cooling system. The prior art has failed to recognize the need or desirability of forming cooling system tubing, pump housings, and/or heat exchangers of material having extremely low vapor transmission rates, and thus has not included tubing formed of FEP, PVDF, ETFE, PTFE or a fluoro-elastomer, nor a pump housing or heat exchanger formed of a liquid crystal polymer.

The fan shroud described herein combines the functions of housing the fan impeller and coupling airflow to direct air through the heat exchanger. Consequently, the fan shroud is more cost effective and space efficient than conventional arrangements in which a separate fan shroud and housing are provided. The savings in space permitted by the fan shroud described herein may be critical in allowing the cooling system to fit in a wide variety of chassis geometries. In addition, securing the fan assembly to the heat exchanger by snap fitting promotes efficient and low cost production of the cooling system by eliminating fasteners and use of tools. Similarly, features provided in certain embodiments of the cooling system allow the heat exchange unit to be mounted in the computer chassis by snap fitting, thereby promoting efficient installation and/or removal of the cooling system by eliminating use of fasteners and tools.

The fan shroud described herein may also include an enclosure to accommodate the pump, which may aid in providing a compact and efficient design for the cooling system and may aid in containing coolant in the event of a leak from the pump. Also, since the pump enclosure portion of the fan shroud may be in fluid communication with the fan housing portion of the shroud, air from the fan may be directed around the pump, to aid in cooling the pump.

The fan shroud described herein may also be used to route and/or conceal the electrical connections to the fan and pump and may aid in conveniently locating wiring ports on the shroud.

The arrangement described herein, in which the inlet and outlet ports for the pump are respectively coupled to inbound and outbound portions of the first heat exchanger tank, promotes convenient positioning of the pump relative to the heat exchanger, promotes an overall space-efficient configuration of the heat exchange unit, and minimizes the length of tubing required to join the pump to the heat exchanger. This arrangement also allows the heat exchanger inlet and outlet ports to be located adjacent to each other, with the above-noted advantages in regard to tube routing between the heat exchanger and the cold plate.

The cooling system described herein uses an inert pressurizing gas and a sealed fluid-containing space to avoid pump cavitation. Therefore, unlike conventional cooling systems, the cooling system described herein has minimal coolant loss, and so does not require fluid servicing. Also, the present cooling system does not depend on atmospheric pressure or additional hardware such as a bellows to maintain fluid pressure at the pump.

The present cooling system includes a gas-bubble-confinement portion to prevent bubbles of pressurized gas from reaching any part of the fluid-containing space in which bubbles might be detrimental.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A cooling system, comprising:
 a fluid-containing space, formed of:
  a cold plate configured to serve as a heat sink for an integrated circuit;
  a heat exchanger;

tubing that interconnects the cold plate and the heat exchanger; and a pump volume in fluid communication with the heat exchanger; and a coolant contained within the fluid-containing space;

wherein the fluid-containing space is substantially gas-tightly sealed and is gas-pressurized.

2. The cooling system of claim 1, wherein a pressurizing gas contained in the cooling system is an inert gas.

3. The cooling system of claim 2, wherein the inert gas includes nitrogen.

4. The cooling system of claim 1, wherein the fluid-containing space includes a gas-bubble-confinement portion.

5. The cooling system of claim 4, wherein the gas-bubble-confinement portion includes a gas barrier to confine a pressurizing gas in the gas-bubble-confinement portion.

6. The cooling system of claim 5, wherein the gas barrier includes a plurality of perforations configured to allow passage of the coolant therethrough while preventing passage of the pressurizing gas therethrough.

7. The cooling system of claim 1, wherein the tubing includes a pair of flexible, parallel tubes, the tubes being in contact with each other along a course of the tubes from the heat exchanger to the cold plate.

8. The cooling system of claim 7, wherein the cold plate has a pair of ports to accommodate connection of the tubes to the cold plate, the ports being adjacent to each other.

9. The cooling system of claim 1, wherein the tubing includes a material selected from the group consisting of a fluoro-elastomer, FEP, PVDF, ETFE and PTFE.

10. The cooling system of claim 1, wherein the pump volume is defined by a pump housing, the pump housing being formed of a material that includes a liquid crystal polymer.

11. The cooling system of claim 1, wherein the coolant includes propylene glycol.

12. The cooling system of claim 1, further comprising a fan to impel air toward the heat exchanger.

13. The cooling system of claim 12, further comprising a fan shroud mounted by snap-fitting to the heat exchanger and configured to direct to the heat exchanger air impelled by the fan.

14. The cooling system of claim 13, wherein the fan shroud includes:

a substantially rectangular base shaped and sized to match a major face of the heat exchanger;

a plurality of snap-fittings integrally formed with the base and extending in a first direction from the base;

a cylindrical fan housing integrally formed with the base and extending in a second direction from the base and configured to surround the fan, the second direction being opposite to the first direction; and a generally parallelepiped enclosure abutting and in fluid communication with the cylindrical fan housing and configured to accommodate a pump housing in the parallelepiped enclosure, the pump housing defining the pump volume.

15. The cooling system of claim 14, wherein the pump housing is part of a pump to circulate the coolant in the fluid-containing space, and the fan shroud includes at least one channel to accommodate power wiring for at least one of the pump and the fan.

16. The cooling system of claim 1, wherein the cold plate is configured to serve as a heat sink for a microprocessor.

17. A cooling system, comprising;

a cold plate configured to serve as a heat sink for an integrated circuit;

a heat exchanger in fluid communication with the cold plate; and a pump housing in fluid communication with the heat exchanger;

wherein the pump housing is at least partially formed of a material that includes a liquid crystal polymer.

18. The cooling system of claim 17, wherein the heat exchanger is formed of the material that includes the liquid crystal polymer.

19. The cooling system of claim 17, further comprising flexible tubing that connects the cold plate to the heat exchanger.

20. A cooling system, comprising:

a fluid-containing space, formed of:
a cold plate configured to serve as a heat sink for an integrated circuit;
a heat exchanger;
a pair of flexible, parallel tubes interconnecting the cold plate and the heat exchanger, the tubes including a material selected from the group consisting of a fluoro-elastomer, FEP, PVDF, ETFE and PTFE; and
a pump volume defined by a pump housing and in fluid communication with the heat exchanger; and a coolant that includes propylene glycol and is contained in the fluid-containing space;

wherein the fluid-containing space is substantially gas-tightly sealed and pressurized by an inert gas;

the fluid-containing space including a gas-bubble-confinement portion which has a gas barrier to confine the inert gas in the gas-bubble-confinement portion, the gas barrier including a plurality of perforations configured to allow passage of the coolant therethrough while preventing passage of the inert gas therethrough;

the pump housing and the heat exchanger being formed of a material that includes a liquid crystal polymer;

the cooling system further comprising:

a fan to impel air toward the heat exchanger; and a fan shroud mounted to the heat exchanger and configured to direct to the heat exchanger air impelled by the fan, the fan shroud including:
a substantially rectangular base shaped and sized to match a major face of the heat exchanger;
a plurality of snap-fittings integrally formed with the base and extending in a first direction from the base;
a cylindrical fan housing integrally formed with the base and extending in a second direction from the base and configured to surround the fan, the second direction being opposite to the first direction; and
a generally parallelepiped enclosure abutting and in fluid communication with the cylindrical fan housing and configured to accommodate the pump housing in the parallelepiped enclosure.

21. The cooling system of claim 20, wherein the inert gas includes nitrogen.

22. The cooling system of claim 20, wherein the tubes are in contact with each other along a course of the tubes from the heat exchanger to the cold plate.

23. A computer, comprising:

a chassis;

a motherboard mounted in the chassis;

a microprocessor mounted on the motherboard; and a cooling system mounted in the chassis and including a cold plate positioned in proximity to the microprocessor, the cooling system including:
 a fluid-containing space formed by the cold plate and a heat exchanger;
  tubing that interconnects the cold plate and the heat exchanger; and
  a pump volume in fluid communication with the heat exchanger; and
 a coolant contained within the fluid-containing space;
wherein the fluid-containing space is substantially gas-tightly sealed and is gas-pressurized.

24. The computer of claim 23 wherein the tubing includes a material selected from the group consisting of a fluoro-elastomer, FEP, PVDF, ETFE and PTFE.

25. The computer of claim 23, wherein the pump volume is defined by a pump housing, and at least one of the pump housing and the heat exchanger is at least partially formed of a material that includes a liquid crystal polymer.

26. The computer of claim 23, wherein the fluid-containing space includes a gas-bubble-confinement portion.

27. The computer of claim 26, wherein the gas-bubble-confinement portion includes a gas barrier to confine a pressurizing gas in the gas-bubble-confinement portion.

28. The cooling system of claim 1, wherein the cold plate has a pair of ports to accommodate connection of the tubing to the cold plate.

* * * * *